United States Patent [19]
Chih

[11] Patent Number: 6,128,221
[45] Date of Patent: Oct. 3, 2000

[54] CIRCUIT AND PROGRAMMING METHOD FOR THE OPERATION OF FLASH MEMORIES TO PREVENT PROGRAMMING DISTURBANCES

[75] Inventor: Yue-Der Chih, Hsinchu, Taiwan

[73] Assignee: Taiwan Semiconductor Manufacturing Co., Ltd., Hsinchu, Taiwan

[21] Appl. No.: 09/150,666

[22] Filed: Sep. 10, 1998

[51] Int. Cl.[7] ............................................. H03K 17/687
[52] U.S. Cl. ........................... 365/185.18; 365/185.02; 365/185.21
[58] Field of Search ........................ 365/185.33, 185.02, 365/185.18, 185.28, 185.21

[56] References Cited

U.S. PATENT DOCUMENTS

| | | | |
|---|---|---|---|
| 5,253,201 | 10/1993 | Atsumi et al. | 365/185.23 |
| 5,402,370 | 3/1995 | Fazio et al. | 365/185.26 |
| 5,550,772 | 8/1996 | Gill | 365/185.03 |
| 5,736,891 | 4/1998 | Buti et al. | 327/434 |

*Primary Examiner*—David Nelms
*Assistant Examiner*—Hoai V. Ho
*Attorney, Agent, or Firm*—Harol L. Novick; Nath & Associates

[57] ABSTRACT

A circuit for the operation of flash memories is proposed. By applying a raised voltage on unselected bit lines of a flash memory array during the programming process, the present invention prevents unselected flash cells from undesired programming disturbances. In the programming process, unselected bit lines of the flash memories are provided with a raised voltage higher than the high state operating voltage of the flash memories, in order to prevent undesired disturbances. In the operation circuit, a current limiting circuit is applied for providing the drain current, and a raised voltage source is employed for supplying a raised voltage to the current limiting circuit, in order provide a raised voltage for unselected bit lines.

16 Claims, 2 Drawing Sheets

CIRCUIT AND PROGRAMMING METHOD FOR THE OPERATION OF FLASH MEMORIES TO PREVENT PROGRAMMING DISTURBANCES

FIELD OF THE INVENTION

The present invention relates to an operation circuit and a programming method of memories, and more specifically, to the operation circuit and the programming method of flash memories for preventing unselected cells from undesired programming disturbances.

BACKGROUND OF THE INVENTION

With the continuous progress in electric industry, more and more electrical device are developed and employed in daily life to improve convenience and living qualities. Computers, communications, and consumer products are identified to be most impressive applications of the twentieth century. In various applications, memory devices are inevitably utilized as vital elements in providing essential information and providing storage space for data exchange. In recent years, one of the non-volatile memories, flash memories, are employed in more and more applications.

With the non-volatile characteristics, the flash memories can be programmed with numerous times and maintaining the programmed state without the need of a continuously supplied power. The flash memories has been widely applied in various memorization usage. With the continuous narrowing or scaling down of the semiconductor processes in manufacturing flash memories, the number of flash cells per unit chip area can be raised and the operating characteristics can be improved.

Referring to FIG. 1, a schematic diagram of four neighboring flash cells 10, 12, 14 and 16 is illustrated. It is a well known design in a flash array for cells to share a common source region or common source line in a group. The flash cells 10, 12, 14 and 16 share a common line SL, as indicated in the figure. The flash cells 10 and 12 have a common word line WL0 and the flash cells 14 and 16 have another common word line WL1. The drain junctions of the flash cells 10 and 14 are connected to a common bit line BL0 and the drain junctions of the flash cells 12 and 16 are connected to another common bit line BL1. During the programming process of a flash memory array with staked gate design, a cell to be programmed, for example the cell 10, is selected with the corresponding bit line BL0 and the corresponding word line WL0. A programming voltage is applied to the common source line SL and a selecting voltage is applied to the word line WL0. In general, the selecting voltage is about the value of the threshold voltage Vt of the transistor. The bit line BL0 of the selected cell 10 is about VSS and the unselected bit line BL1 is at about VDD or about VDD−Vt, wherein VDD and VSS respectively represent a high state and a low state of the operating voltages of the flash memory cells.

With the selecting process and an appropriate voltage, the selected cell 10 can be programmed with the designed state. However, the unselected cell 12, which is supposed to maintain it's original state without the influence of the programming process, is found to be easily disturbed with the configuration. During the programming of the cell 10, the source of the cell 12 has a high programming voltage, for example a voltage of 12 volts. The drain of the cell 12 is set at about VDD or about VDD−Vt. The source to drain voltage is about 12-VDD or (12 −VDD+Vt) for the unselected cell 12. The voltage difference as high as 8 to 9 volts is large enough to cause the punch-through disturb to the cell. With the continuous narrowing down of the cell size and the operating voltage of the flash cells, the flash cells being operated at low VDD is found to seriously suffer the harm of programming or writing disturbance.

SUMMARY OF THE INVENTION

The present invention disclose an operation circuit and a programming method of flash memories. One of the application of the present invention is for preventing unselected flash cells from undesired programming disturbances during the programming process. It is one of the advantages of the present invention to solve the disturbance problem in order to further scaling down the cell size and the operating voltage of the flash cells without the prior art issue.

The operation circuit for flash memories of the present invention includes a flash memory array, a current limiting circuit, an array ground switch, and a raised voltage source. The flash memories are operated between a high state operating voltage and a low state operating voltage. The current limiting circuit is connected to bit lines of the flash memory array for providing a drain current. The array ground switch is employed for controlling an array ground connection to the bit lines. The raised voltage source is applied for providing the current limiting circuit a raised voltage higher than the high state operating voltage of the flash memory array.

The programming method for programming flash memories in the present invention includes the steps of: selecting cells to be programmed; providing unselected bit lines of the flash memories with a raised voltage higher than the high state operating voltage of the flash memories; and programming the cells by applying a programming voltage to source lines of the flash memories. The flash memories are operated between a high state operating voltage and a low state operating voltage. In general, the cells to be programmed can be selected by applying a selecting voltage to selected word lines and the low state operating voltage to selected bit lines.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

The present invention disclose an operation circuit and a programming method of flash memories. The prior art issue of punch-through disturbance can be eliminated and the unselected flash cells can be prevent from undesired programming disturbances. The present invention also provides the operation circuit for further scaling down the cell size and the operating voltage of the flash cells without the prior art issue.

Figure 1:
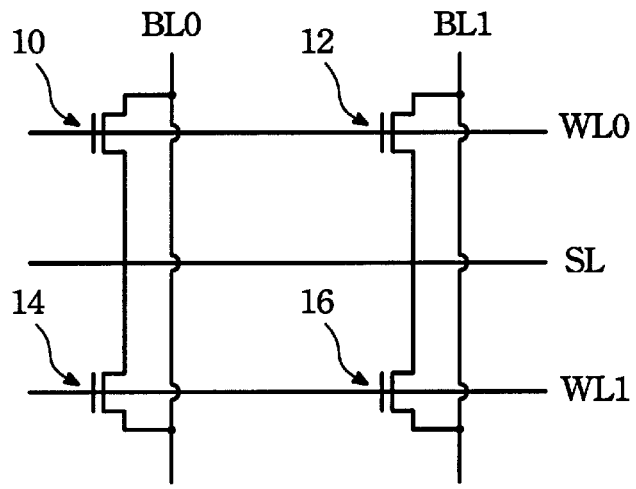
FIG. 1 is a schematic diagram of four flash memory cells in part of a flash memory array.
Figure 2:
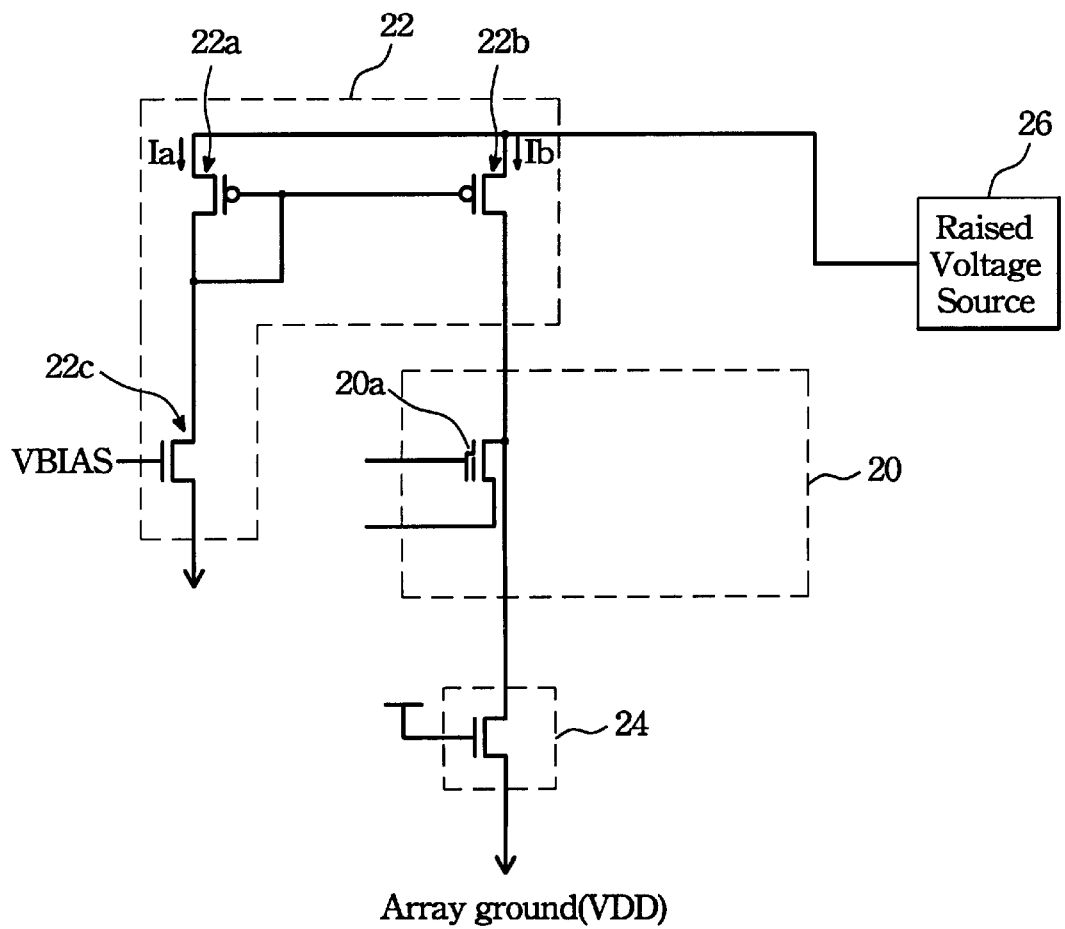
FIG. 2 illustrates a schematic diagram of the operation circuit for flash memories in accordance with the present invention.

Turing to FIG. 2, a schematic diagram of the operation circuit for flash memories of the present invention is illustrated. The operating circuit includes a flash memory array 20, a current limiting circuit 22, an array ground switch 24, and a voltage source 26. The flash memory array 20 can include many flash cells in an single array, the number of the cells in the array can be varied with the design and the system requirements. In general, the flash memory array 20 is operated between a high state operating voltage VDD and a low state operating voltage VSS. As an illustrative example, the high state operating voltage VDD can be about 2 volts to about 5.5 volts and the low state operating VSS can be about 0 volts. During a programming process, the flash memory array 20 can be programmed with a programming voltage at source lines and a selecting voltage at selected word lines, and the low state operating voltage VSS is provided to the selected bit lines. As what is described in the background of the invention, the selecting voltage is about the level of a gate threshold voltage of the flash cells. For the present fabrication process of flash memories, the gate threshold voltage can be about 1 volt to about 3 volts under different cell size, manufacturing process, gate dielectric thickness, and etc. For a clear and focused of the present invention, only one unselected cell 20a of the flash cells is illustrated in the figure.

The current limiting circuit 22 is connected to bit lines of the flash memory array 20 for providing a drain current. The current limiting circuit 22 is in fact a current-limited current source to provide a controlled current to the drains of the flash cells. In the case, the current limiting circuit includes two p-type transistors 22a and 22b and a current controlling n-type transistor 22c. The two p-type transistors 22a and 22b are connected back to back with their gates and with the drains connected to the raised voltage source 26. The source of the p-type transistors 22b is connected to the bit lines of the flash memory array 20 and the source of the p-type transistors 22a is connected with its gate. The source and drain junctions of the current controlling n-type transistor 22c is connected between the source of the p-type transistors 22a to an array ground. A gate voltage VBIAS can be applied to control the current through the n-type transistor 22c. The above connections construct a current mirror by which the current Ia through the p-type transistors 22a is mirrored to the current Ib through the p-type transistors 22b. The current Ia is controlled with the controlling voltage VBIAS.

The array ground switch 24 is employed for controlling an array ground connection to the bit lines. In the case, a n-type transistor can be used as the array ground switch 24 and the array ground connection is connected to the high state operating voltage VDD. The raised voltage source 26 provides the current limiting circuit 22 a raised voltage higher than the high state operating voltage VDD of the flash memory array 20. In the preferred embodiments, the raised voltage source Vr is higher than the high state operating voltage VDD by at least one times the gate threshold voltage Vt of the flash memory array, that is $Vr=VDD+n*Vt$, wherein $n \geq 1$ In general, the raised voltage source 26 can be a voltage pumping circuit which is used to provide a higher voltage from the supplying high state voltage VDD and the low state voltage VSS.

Figure 3:
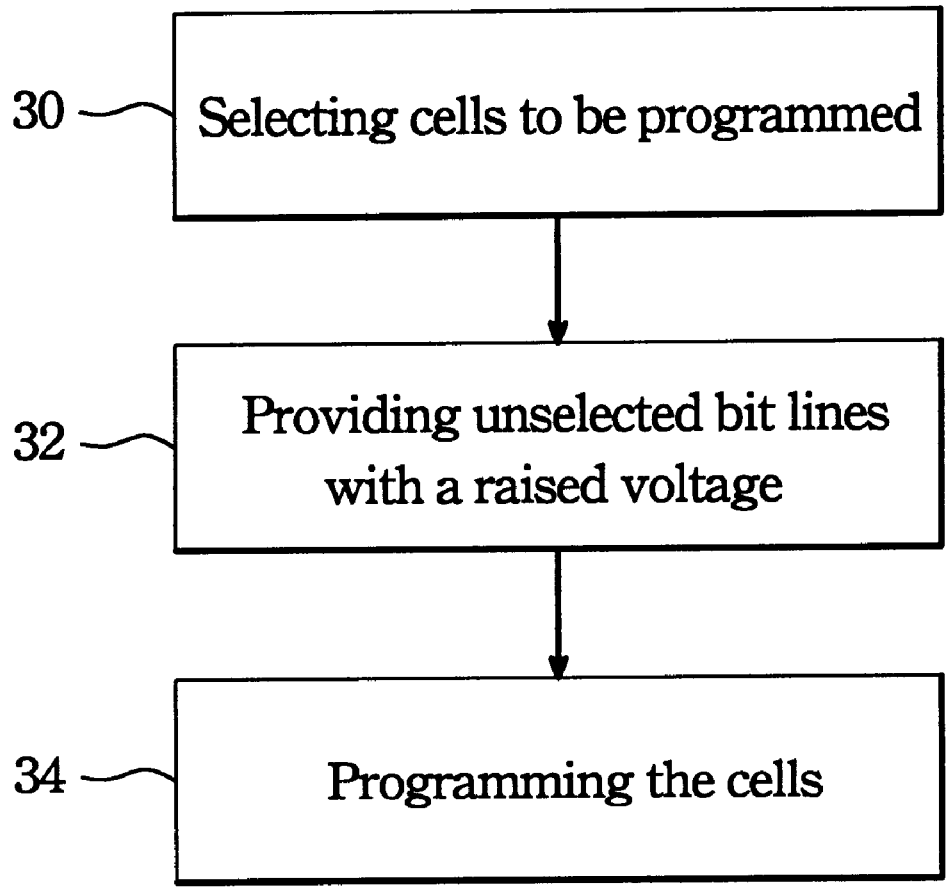
FIG. 3 illustrates a schematic flow diagram of the programming method for flash memories in accordance with the present invention.

Referring to FIG. 3, a schematic flow diagram of the programming method of the flash memories in the present invention is illustrated. At first, cells to be programmed in a flash memory can be selected in the step 30 by picking corresponding word lines and bit lines of the flash memory cells. In the case, the selected word lines is applied with a selecting voltage and the selected bit lines is connected to the low state operating voltage VSS. As an example, the selected bit lines can be drawn down to the low state operating voltage VSS with a well known current source under a high current.

In the step 32, unselected bit lines of the flash memories are provided with a raised voltage higher than the high state operating voltage VDD of the flash memories. In the preferred embodiments, the raised voltage source Vr is higher than the high state operating voltage VDD by at least one times the gate threshold voltage Vt of the flash memory array, that is $Vr=VDD+n*Vt$, wherein $n \geq 1$ In the case, the raised voltage can be provided through a current limiting circuit 22 connected to the selected and the unselected bit lines. The current limiting circuit 22 is then connected with a raised voltage source 26 or a voltage pumping circuit to provide the actual raised voltage, as indicated in FIG. 2. Therefore, the raised voltage can be provided through the current limiting circuit 22 to the unselected bit lines by weakly turning-on the PMOS 22b, while the voltage of the selected bit lines can be drawn down to the low state operating voltage VSS with the current source.

Finally, in the step 34, the selected cells are programmed by applying a programming voltage to the source lines of the flash memories. With the different scale of the flash memory cells and the system design, the programming voltage Vp to the source lines can be about 5 volts to as high as about 20 volts. Therefore, the selected cells can be programmed with a large enough source to drain voltage, namely Vp−VSS in the case. The unselected cells with a much smaller drain to source voltage difference of (Vp−VDD+n*Vt) can be maintained with the original recorded state without the programming disturbance issue in the prior art. The punch-through disturb of the conventional operational circuit of the flash memories can be eliminated.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An operation circuit for flash memories, said flash memories being operated at a high state operating voltage and a low state operating voltage, said operating circuit comprising:

a flash memory array;

a current limiting circuit connected to bit lines of said flash memory array for providing a drain current;

an array ground switch for controlling an array ground connection to said bit lines; and a raised voltage source for providing said current limiting circuit a raised voltage higher than said high state operating voltage of said flash memory array.

2. The operation circuit of claim 1, wherein said flash memory array is programmed with a programming voltage on source lines and a selecting voltage on word lines.

3. The operation circuit of claim 2, wherein said selecting voltage is a voltage of about a gate threshold voltage of said flash memories.

4. The operation circuit of claim 1, wherein said current limiting circuit comprises two p-type transistors and a current controlling n-type transistor.

5. The operation circuit of claim 1, wherein said array ground switch comprises a n-type transistor.

6. The operation circuit of claim 1, wherein said array ground connection is connected to said high state operating voltage.

7. The operation circuit of claim 1, wherein said raised voltage source comprises a voltage pumping circuit.

8. The operation circuit of claim 1, wherein said raised voltage of said raised voltage source is higher than said high state operating voltage by at least one gate threshold voltage of said flash memory array.

9. The operation circuit of claim 1, wherein said high state operating voltage is about 2 volts to about 5.5 volts and said low state operating voltage is about 0 volts.

10. A programming method for programming flash memories, said flash memories being operated at a high state operating voltage and a low state operating voltage, said programming method comprising the steps of:

selecting cells to be programmed;

providing unselected bit lines of said flash memories with a raised voltage higher than said high state operating voltage of said flash memories, said raised voltage is provided through a current limiting circuit connected to said unselected bit lines; and programming said cells by applying a programming voltage to source lines of said flash memories.

11. The programming method of claim 10, wherein said cells are selected by applying a selecting voltage to selected word lines and said low state operating voltage to selected bit lines.

12. The programming method of claim 11, wherein said selecting voltage is a voltage of about a gate threshold voltage of said flash memories.

13. The programming method of claim 10, wherein said current limiting circuit comprises two p-type transistors and a current controlling n-type transistor.

14. The programming method of claim 10, wherein said raised voltage is provided with a voltage pumping circuit.

15. The programming method of claim 10, wherein said raised voltage is higher than said high state operating voltage by at least one gate threshold voltage of said flash memories.

16. The operation circuit of claim 10, wherein said high state operating voltage is about 2 volts to about 5.5 volts and said low state operating voltage is about 0 volts.

* * * * *